United States Patent
Orio et al.

(10) Patent No.: US 8,201,052 B2
(45) Date of Patent: Jun. 12, 2012

(54) DATA PROCESSING METHOD OF DECODING CODED DATA AND DATA PROCESSOR FOR THE SAME

(75) Inventors: Masao Orio, Kanagawa (JP); Mitsunori Takanashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 896 days.

(21) Appl. No.: 12/285,751

(22) Filed: Oct. 14, 2008

(65) Prior Publication Data

US 2009/0113270 A1   Apr. 30, 2009

(30) Foreign Application Priority Data

Oct. 29, 2007   (JP) .................................. 2007-280083

(51) Int. Cl.
*G11C 29/00* (2006.01)
(52) U.S. Cl. ........................................ 714/763; 714/776
(58) Field of Classification Search .................. 714/763, 714/776
See application file for complete search history.

(56) References Cited

U.S. PATENT DOCUMENTS

| 5,436,918 | A | | 7/1995 | Kato et al. | |
|---|---|---|---|---|---|
| 5,504,759 | A | * | 4/1996 | Inoue et al. | .................... 714/755 |
| 2004/0047602 | A1 | * | 3/2004 | Ohbi et al. | ...................... 386/95 |
| 2005/0249301 | A1 | * | 11/2005 | Jeong et al. | .................... 375/265 |
| 2007/0121748 | A1 | * | 5/2007 | Park et al. | ...................... 375/265 |

FOREIGN PATENT DOCUMENTS

| JP | 5-55932 (A) | 3/1993 |
|---|---|---|
| JP | 2001-24717 (A) | 1/2001 |
| JP | 2006-345080 | 12/2006 |

OTHER PUBLICATIONS

Notification of Reason(s) for Refusal dated Feb. 14, 2012, with English translation.

* cited by examiner

*Primary Examiner* — M. Mujtaba K Chaudry
(74) *Attorney, Agent, or Firm* — McGinn IP Law Group, PLLC

(57) ABSTRACT

For the coded data that was transmitted via a communication channel, a known code portion thereof that is a code portion corresponding to known data is detected. When the known code portion is not detected from the coded data, the coded data will be decoded. When the known code portion is detected from the coded data, at least a part thereof will be replaced with normal data, and the decoding will be performed on the coded data after the substitution.

12 Claims, 15 Drawing Sheets

USER DATA PACKET

USER DATA PACKET

USER DATA PACKET

DATA PROCESSING METHOD OF DECODING CODED DATA AND DATA PROCESSOR FOR THE SAME

BACKGROUND OF THE INVENTION

1. Field of the Invention

The present invention relates to data processing technology, and more specifically, to a technology of decoding coded data.

2. Description of Related Art

In the digital transmission system, in order to secure reliability of data transmitted and received, the error correcting code and the error detecting code are used. FIG. 16 is a schematic diagram that outlines a digital transmission system in which an error correcting code and an error detecting code are used.

As shown in FIG. 16, the transmitting side performs error detection coding and error correction coding on the data that is intended to be transmitted to the opposite party (transmission data), subsequently modulates it to obtain the modulated coded data, and outputs it into a communication channel. In the communication channel, there is a possibility that a noise leading to an error may mix with this data.

A receiving side demodulates the received data to obtain the coded data and decodes this coded data. The receiving side performs error correcting in the decoding, and performs error detection on decoded data obtained by the decoding. Usually, when the error correction is incomplete as a result of the error detection, the receiving side requires the transmitting side to retransmit the data.

If errors are detected frequently, then many retransmissions will also occur and efficiency of the communication system will fall. Especially, in mobile communication systems, since the intensity of a radio wave varies substantially due to influences of fading etc. and noise is easy to mix, this problem is salient. Therefore, the receiving side is required to have a high correction capability.

Patent Document (Japanese Unexamined Patent Application Publication No. 2006-345080) discloses a technique of improving an error correction capability. FIG. 17 and FIG. 18 correspond to FIG. 1 and FIG. 2 in the Patent Document, respectively; FIG. 16 shows a receiver set to which the technique of the Patent Document is applied; and FIG. 17 is a flowchart showing a flow of processing by the receiver set.

In the receiver set shown in FIG. 16, an antenna unit 11 receives a frame via a network, and a demodulator unit 12 demodulates the received frame (S11). An error correction unit 13 performs an error correction processing on the frame after the demodulation. In the error correction unit 13, for example, Reed-Solomon decoding and further Viterbi decoding are performed.

The error detection unit 14 performs an error detection processing based on an error detecting code included in the frame after the error correction processing (S12, S13). The error detecting code is, for example, CRC (Cyclic Redundancy Check).

The error correction unit 15 performs an error correction processing on the frame from which the error was detected in the error detection unit 14 (S14: Yes, S15: Yes, S16). This error correction processing replaces a portion of the frame using the known information acquired in advance. For example, a transmitter address included in the frame from which an error was detected and the like are replaced with a terminal address in the same network acquired in advance.

After that, the error detection unit 14 and the error correction unit 15 repeat processings of Steps S13 to S16 plural times until the error disappears in the frame (S13, S14: Yes, S15, S16, S13, . . . ). Moreover, when the error still exits but a predetermined terminating condition is fulfilled (S15: No), the retransmission control unit 16 performs a retransmission control (S17). In the retransmission control, for example, the retransmission control unit 16 makes the transmitting side retransmit the frame by not returning the ACK (Acknowledgement) frame for the received frame.

In this way, the technique disclosed by the Patent Document enhances the error correction capability by repeatedly performing a process whereby a part of a field of the frame in which an error was detected is replaced with known information that is normal data and the error detection processing is performed again on the frame after the substitution, and as a result, controls a detection frequency of errors or the number of times of retransmission.

SUMMARY

The mentioned code technique is known as the representative technique of the error correcting code. This technique uses past codes whose number is equal to the constraint length K to create a new code in order to improve the error correction capability. Therefore, the codes in the convolutionally coded data will be mutually related to, and at the time of the decoding, codes of a portion into which a noise was mixed will affect other codes.

A technique of the Patent Document replaces, for data after the decoding, a part of data thereof with the normal data. When this part of the data has an error, the error in the data can be corrected. However, when decoding, an error in other data for which this portion of the data was used cannot be corrected, and an improvement effect of the error correction capability is restricted.

One mode of the present invention is a data processing method. This data processing method replaces, for the coded data, at least a part of a portion thereof corresponding to known data with the normal data, and decodes the coded data after the substitution.

Another mode of the present invention is a data processor. This data processor is equipped with a first storage unit, a receive unit, a known-code-portion detecting unit, a first substitution unit, and a decoder unit.

The first storage unit stores the normal data of the known code portion that may be included in the coded data. This known code portion is a portion that corresponds to the known data in the coded data.

The receive unit receives the coded data, and the known-code-portion detecting unit detects a known code portion for the coded data received by the receive unit.

The first substitution unit replaces at least a part of the known code portion detected by the known-code-portion detecting unit with the normal data stored in the first storage unit.

As a result of detection by the known-code-portion detecting unit, the decoder unit decodes the coded data received by the receive unit when there is no known code portion; the decoder unit decodes the coded data that was replaced by the first substitution unit when there is the known code portion.

Further, another mode of the present invention is a program product. This program product makes a computer execute a step of, for the coded data, detecting a portion thereof corresponding to the known data and a step of replacing at least a part of the portion corresponding to the detected known data with the normal data before the coded data is decoded.

With the technology according to the present invention, in decoding the data that was error correction coded, the error correction capability can be enhanced more.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Before explaining exemplary embodiments of the present invention, first a principle of the present invention will be explained.

In many of digital transmission systems of these days, the transmitting side packetizes data that is intended to be transmitted and codes it. For the convenience of explanation, hereafter, this data is called "user data" and the user data that is packetized is called a "user data packet."

Although the size of the packet varies with a standard, usually, plural different packet sizes have been specified. In performing packetization, a packet of a size that is closest to the size of the user data is selected.

Figure 1:
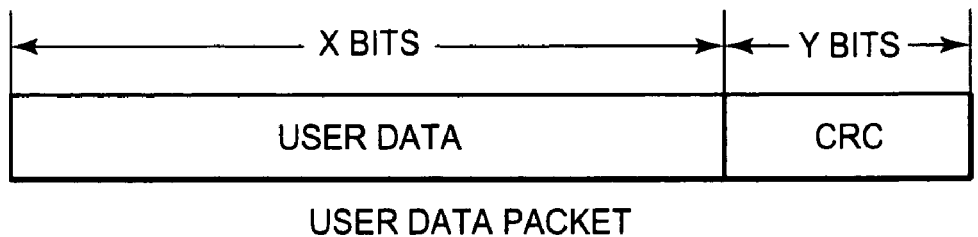
FIG. 1 is a diagram showing an example of a user data packet (first of three)
Figure 2:
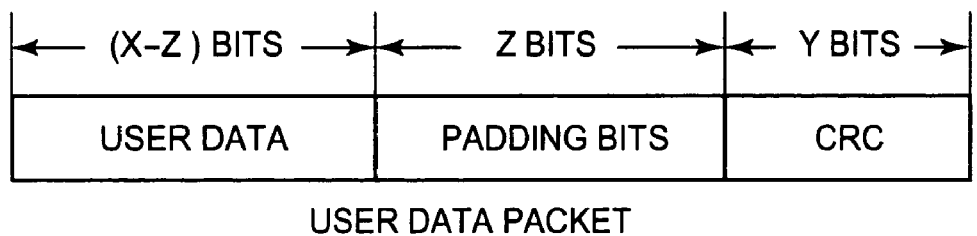
FIG. 2 is a diagram showing the example of the user data packet (second of three)
Figure 3:
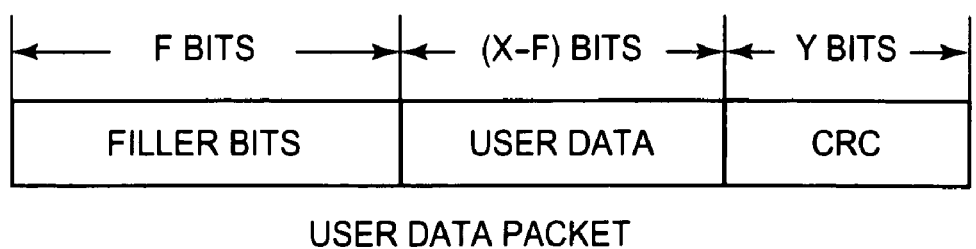
FIG. 3 is a diagram showing the example of the user data packet (third of three)

FIGS. 1 to 3 show a configuration example of the user data packet prior to error correction coding. The user data packet shown in FIG. 1 has a packet size of "X+Y" bits, and is composed of user data of X bits and a CRC of Y bits. This user data packet is an example in the case where a sum of the numbers of bits of the user data and of the CRC is equal to the packet size.

In the case where the number of bits of the user data is smaller than X and a packet size that is closest to the sum of the numbers of bits of the user data and of the CRC is "X+Y" bits, a packet of the "X+Y" bits is selected. In order to compensate insufficient bits, specified data, such as a padding bit, a filler bit, etc. is inserted thereinto. The Padding bit is inserted between the user data and the CRC; the filler bit is inserted in front of the user data.

FIG. 2 shows an example of the user data packet when the padding bits are used. Since the packet size is the "X+Y" bits and the number of bits of the user data is "X−Z" bits, the padding bits of Z bits are inserted between the user data and the CRC.

FIG. 3 shows an example of the user data packet when the filler bits are used. Since the packet size is the "X+Y" bits and the number of bits of the user data is "X−F," the filler bits of F bits are inserted in front of the user data. In addition, there are cases where an arrangement pattern of the padding bits and the filler bits has all the bits of 1s and where it has 0s and 1s interwoven with one another.

A standard defines as to whether the padding bits or the filler bits are used to compensate insufficiency of the number of bits and as to the arrangement pattern of the bits to be inserted. Therefore, the bits to be inserted are known in advance to a receiving side.

Usually, a control data packet is transmitted prior to the user data packet. The control data packet is a control data that is made into a packet. The control data includes information on a packet size of the user data packet to be transmitted next, the number of bits of the user data, etc. The receiving side can know which portion of the user data packet is inserted bits based on the control data included in the control data packet.

Since the user data packet received by the receiving side is a user data packet that is error correction coded, as showing FIG. 1 to FIG. 3, a bit part that was inserted is codes corresponding to the inserted bits. This portion has a regularity that accords to the arrangement pattern of the bits to be inserted. Here, an explanation will be given using a concrete example.

Figure 4:
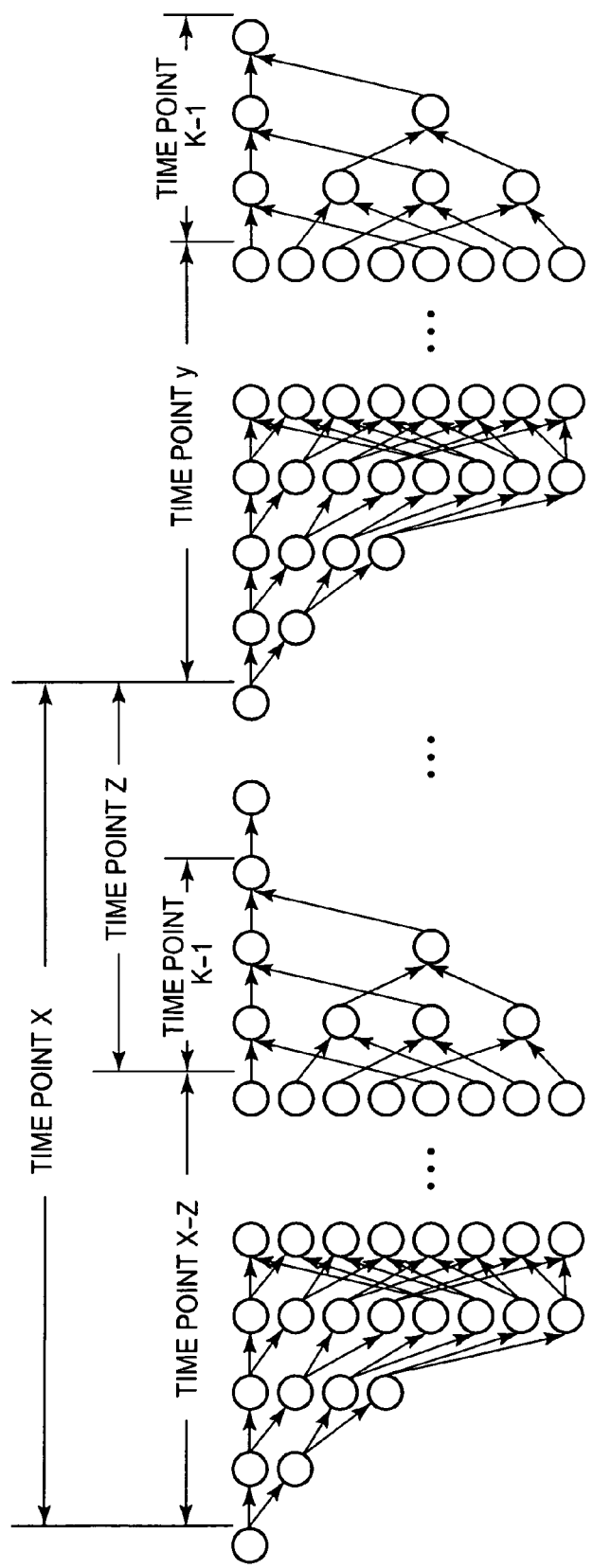
FIG. 4 is a diagram showing an example of transition on a trellis in a convolutional code.

FIG. 4 is trellis coding in the case of convolutionally coding the user data packet shown in FIG. 2 in which all the padding bits are "0s." Incidentally, the convolutional code is assumed not to be recursive and the constraint length is denoted as K.

Transition starts from an initial state (hereinafter referred to as state 0) on a trellis, and when an elapsed time proceeds as far as time point "K−1," all the states reach the transition. FIG. 4 shows the transition from a time point when all the states reach the transition. Transition of all the states continues on the trellis from a time point when all the states reach the transition up to time point "X−Z," as shown in the figure. Since the padding bits "0s" for a period of Z time points are inserted from time point "X−Z+1," the trellis returns to the state 0 at time point "X−Z+K−1." After that, until the insertion of the padding bits is ended, i.e., up to time point X, transition on the state 0 continues on the trellis.

At time point "X+1" and thereafter, CRC of Y bits after the padding bits are inputted sequentially, and therefore the transition starts from the state 0 on the trellis and all the states come to the transition at time point "X+K." After that, until time point "X+Y," that is, until the CRC is ended, transition of all the states continues.

Since "0" of a tail bit that indicates a tail of the data of the packet is inputted at time point "X+Y+1," consequently the trellis returns to the state 0 at time point "X+Y+K−1."

In this way, since the trellis transits regularly according to an input of the padding bit, a part of the code corresponding to the padding bit in the convolutionally coded user data packet can be known in advance. In the example of FIG. 4, from time point "X−Z+1" to time point "X−Z+K−1," the transition on the trellis is affected by the data (user data) inputted at time point "X−Z" or earlier, and consequently a code word cannot be specified. However, the code word from time point "X−Z+K" to time point X can be specified.

Here, zero padding is taken as an example. Also in the case of the padding by "1" and padding of "0" and "1" interwoven with one another, a part of the code word of a portion corresponding to bits being inserted can be known in advance. Incidentally, when the filler bit is used, since previously known bits, such as "0" and "1," are inserted from the head to the input start of the user data, the code word that corresponds to a portion from the head to an end of input of the filler bits can be known in advance.

In the above-mentioned example, it is assumed that the convolutional code is not recursive. In the case where the convolutional code is recursive, when the padding bit is used, it is impossible to know the code word corresponding to it; whereas, when the filler bit is used, it is possible to know the code word corresponding to it.

Here, a case of the turbo code will be explained further. The turbo code attracts attention in recent years as a coding/decoding system that comes near the "Shannon limit" that is a limit of the data transfer rate at which the data can be transmitted. In the turbo code, prior to coding of the second convolutional code of two convolutional codes, the data is once kept in memory. Then, a sequence of the data is mixed by an interleaver for taking out the data in a different sequence. When decoding, two decoders are used and results of the two decoders are fed back to each other and the operation is repeated, whereby the decoding is performed.

Figure 5:
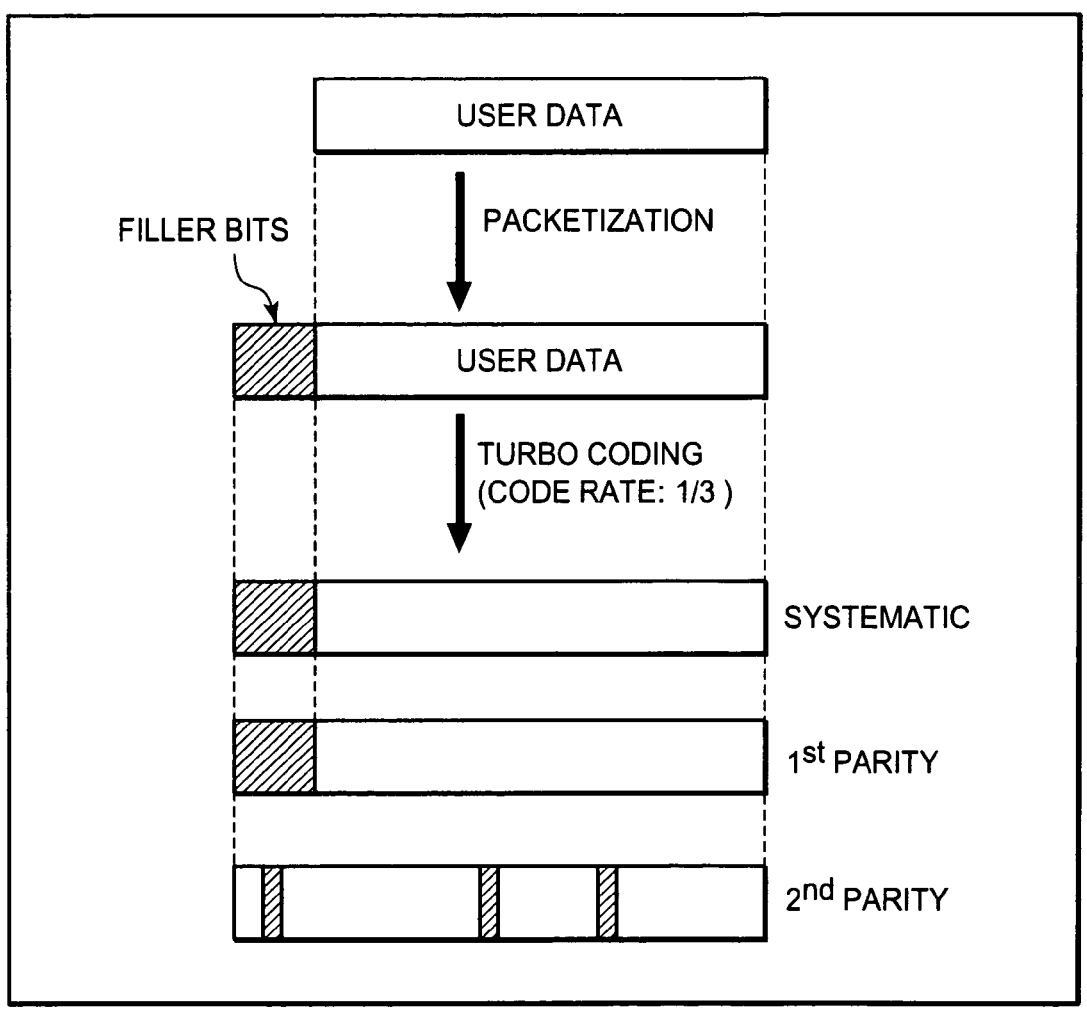
FIG. 5 is a diagram explaining a turbo code.

FIG. 5 shows an elemental code obtained by turbo coding in the case where the filler bit is used. A shaded part in the figure means the filler bit or the code corresponding to the filler bit.

As shown in FIG. 5, the user data has the filler bits inserted therein to become the user data packet. As a result of turbo coding the user data packet so as to have a code rate of one third, three packets of Systematic, First Parity, and Second Parity are obtained. In Systematic and First Parity, the code corresponding to the filler bit is located at a head; in Second parity, the code corresponding to the filler bit is dispersed in the packet by an action of interleaving. Here, Systematic and First Parity are designated as elemental codes 1 and Systematic and Second Parity after interleaving are designated as elemental codes 2. Transitions on the trellis in the each elemental code will be explained.

Figure 6:
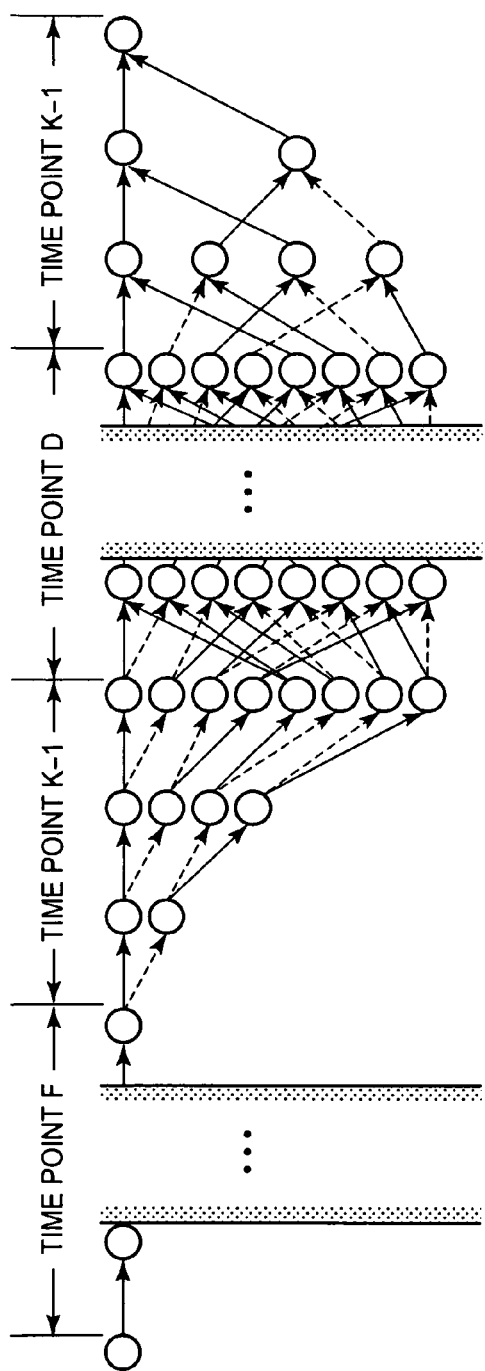
FIG. 6 is a diagram showing an example of transition on the trellis in an elemental code 1 of the turbo code.

FIG. 6 shows a transition on the trellis in the elemental code 1. Incidentally, let a constraint length be K and the number of bits of the filler bit be F bits. As shown in the figure, from the initial state (state 0) to time point F, the state 0 transits on the trellis. Since the user data is inputted at time point "F+1" and thereafter, all the states fall in the transition at time point "F+K−1." After that, until a time point when the input of the user data is ended (time point "F+K−1+D"), the transition of all the states continue, and return to the state 0 by completion processing at time point "F+K−1+D+K−1."

Figure 7:
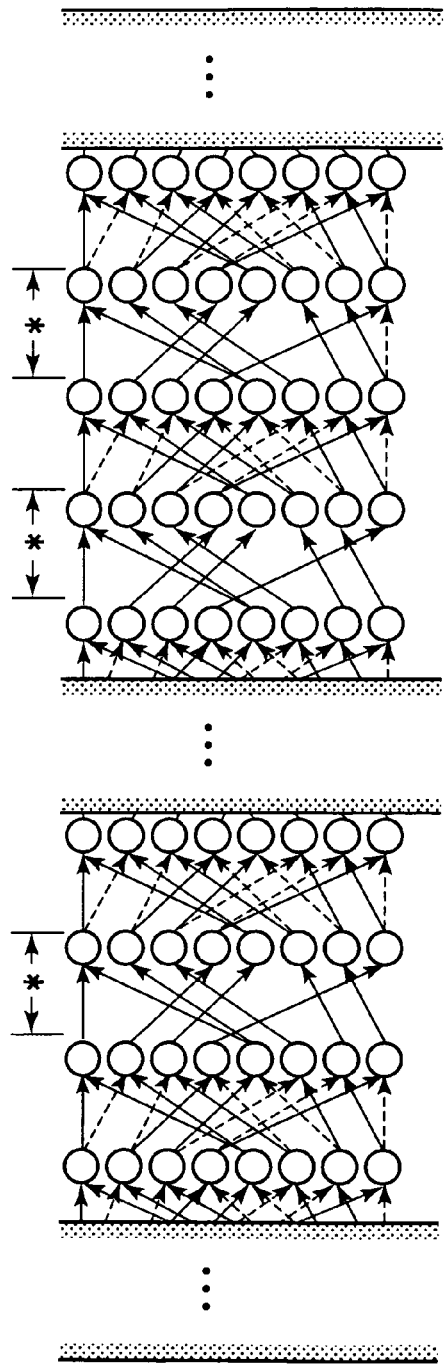
FIG. 7 is a diagram showing an example of transition on the trellis in an elemental code 2 of the turbo code.

FIG. 7 shows a transition on the trellis in the elemental code 2. "*" in the figure denotes the portion corresponding to the filler bit. As shown in the figure, in the case of the elemental code 2, a portion corresponding to the filler bit is dispersed over all time points of the trellis.

That is, in the case of this example, since the portion corresponding to the filler bit is dispersed in the elemental code 2, it is impossible to know the code words corresponding thereto. However, in the elemental code 1, since the trellis transits on the state 0 from the head to time point F, it is possible to know the code word in this period in advance.

As can be understood from the above explanation, in the user data packet that was error correction coded, for the data that is known in advance, such as the padding bit and the filler bit, it is possible to know at least a part of the code word corresponding to these pieces of the data in advance. In the following explanation, data known in advance, such as the padding bit, is called "known data."

As a result of research and trial-and-error, the inventors of this application paid attention to what was described above and have established a technology of enhancing more an error correction capability when decoding error correction coded data. An explanation will be given with reference to FIG. 8.

Figure 8:
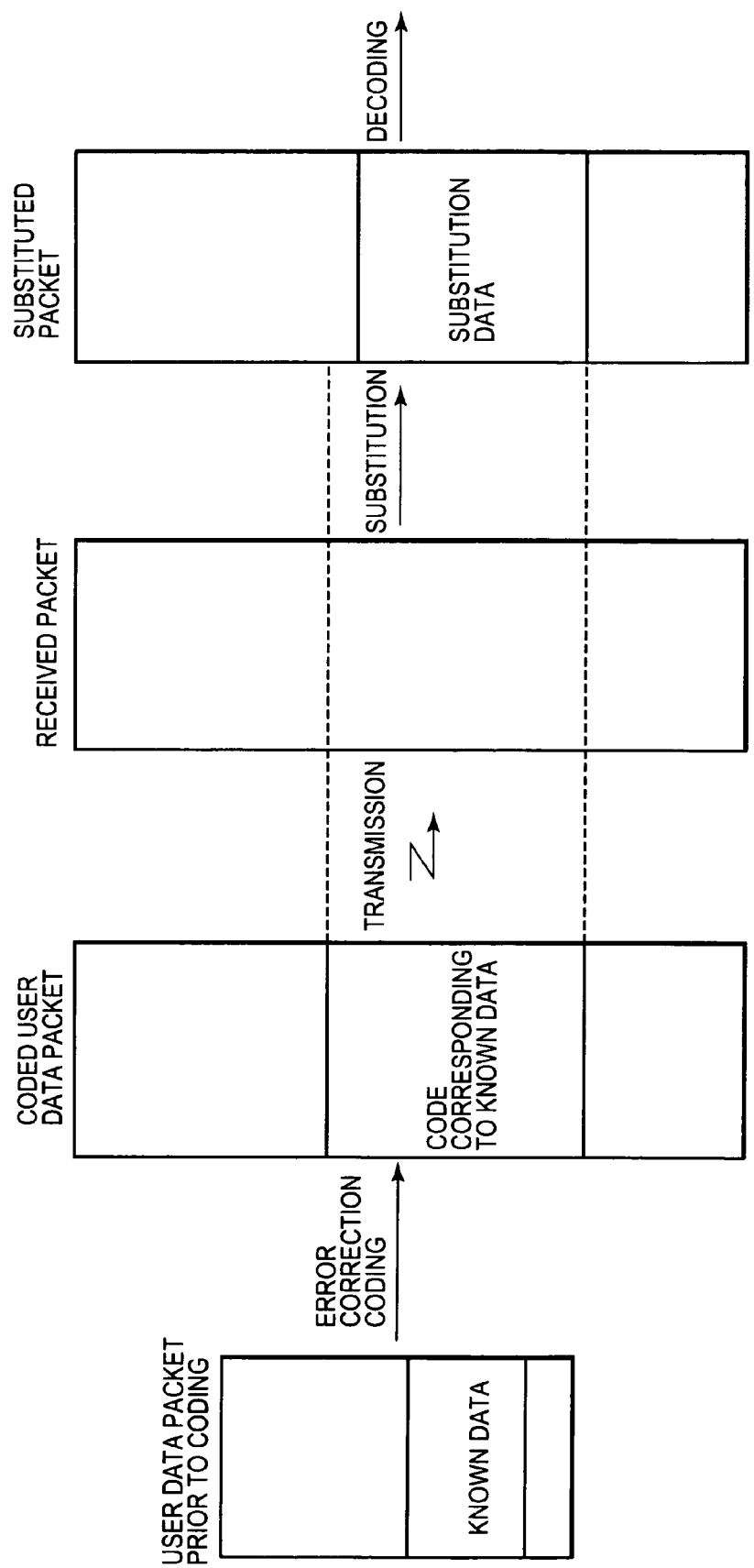
FIG. 8 is a schematic diagram showing a principle as an exemplary of the present invention.

As shown in FIG. 8, the user data packet includes the known data, such as padding bits, and the user data packet after being error correction coded includes a code corresponding to the known data. As mentioned above, at least a portion of code corresponding to the known data is known in advance. Such a coded user data packet is transmitted to the receiving side via a communication channel.

The technology established by the inventors of this application replaces the known portion among the code portion corresponding to the known data (known code portion) with substitution data in the receiving side prior to the decoding of the received packet. This substitution data is a soft bit that corresponds to normal data of the portion to be replaced, i.e., the after-coding data of this portion in the transmitting side. The soft bit is, for example, a soft value equivalent to +128 when the after-coding data is zero, and −128 when it is unity.

By doing this, even if a noise is added to the portion to be replaced in the communication channel, it will be replaced with the normal data. Moreover, since this substitution is performed prior to the decoding, an influence of the noise will not exert other data whose this portion of data is used at the time of the decoding.

As a result, the error correction capability can be enhanced and improved efficiency of the entire communication system can be attained.

Based on the above explanation, embodiments according to the technology of the present invention will be explained.
<First Exemplary Embodiment>

Figure 9:
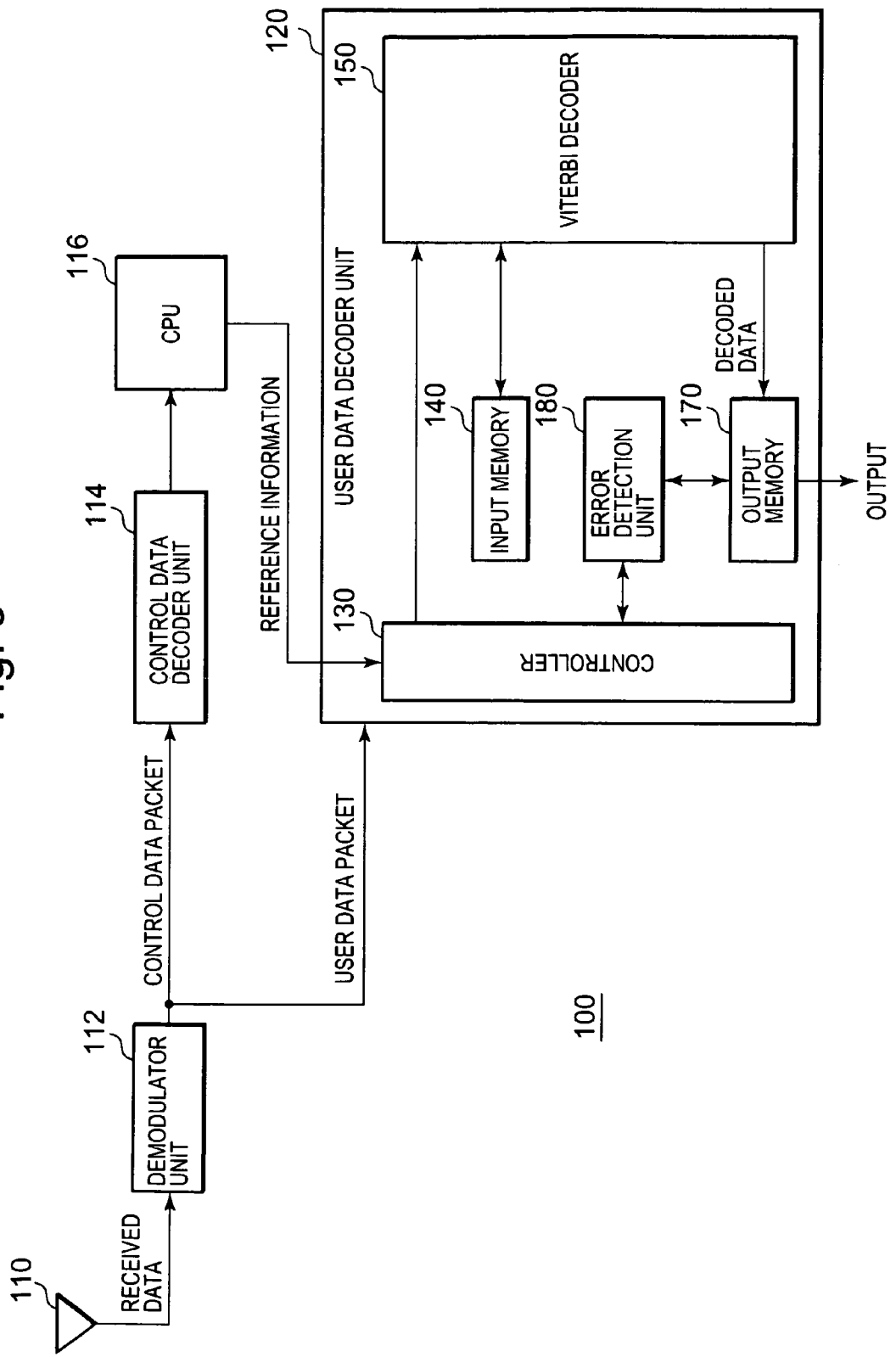
FIG. 9 is a diagram showing a receiver set according to a first exemplary embodiment of the present invention.

FIG. 9 shows a receiver set 100 according to a first exemplary embodiment of the present invention. This receiver set 100 receives data via a network, for example, a wireless communication network, and decodes received data. As an example, in this embodiment, the received data is the user data that was error detection coded and error correction coded and that was further modulated in the transmitting side. As the error correcting code, a convolutional code is used. Moreover, the receiver set 100 uses a technique of Viterbi decoding when decoding.

As shown in FIG. 9, the receiver set 100 is equipped with an antenna 110, a demodulator unit 112, a control data decoder unit 114, a CPU (Central Processing Unit) 116, and a user data decoder unit 120.

The antenna 110 receives data via a wireless communication network, and outputs the received data to the demodulator unit 112. The demodulator unit 112 demodulates the received data. If the demodulated data is the control data packet, the demodulator unit 112 will output it to the control data decoder unit 114; if the demodulated data is the user data packet, the demodulator unit 112 will output it to the user data decoder unit 120.

The control data packet from the demodulator unit 112 is one that is coded. The control data decoder unit 114 decodes it and outputs it to the CPU 116.

Based on the control data from the control data decoder unit 114, the CPU 116 generates reference information necessary to decode the user data packet, and outputs it to the user data decoder unit 120. This reference information includes the packet size of the user data packet, the number of bits of the user data, etc.

The user data decoder unit 120 is equipped with a controller 130, input memory 140, a Viterbi decoder 150, output memory 170, and an error detection unit 180.

The controller 130 is, for example, a DSP (Digital Signal Processor) and controls other components of the user data decoder unit 120. The input memory 140 stores the user data packet from the demodulator unit 112, and provides it to the Viterbi decoder 150. The Viterbi decoder 150 reads the user data packet from the input memory 140, decodes it, and outputs the decoded user data, i.e., decoded data to the output memory 170. The output memory 170 stores the decoded data from the Viterbi decoder 150. The decoded data stored in the output memory 170 undergoes error detection by the error detection unit 180, which later outputs.

The error detection unit 180 performs the error detection on the decoded data stored in the output memory 170, and outputs a result of detection to the controller 130.

Figure 10:
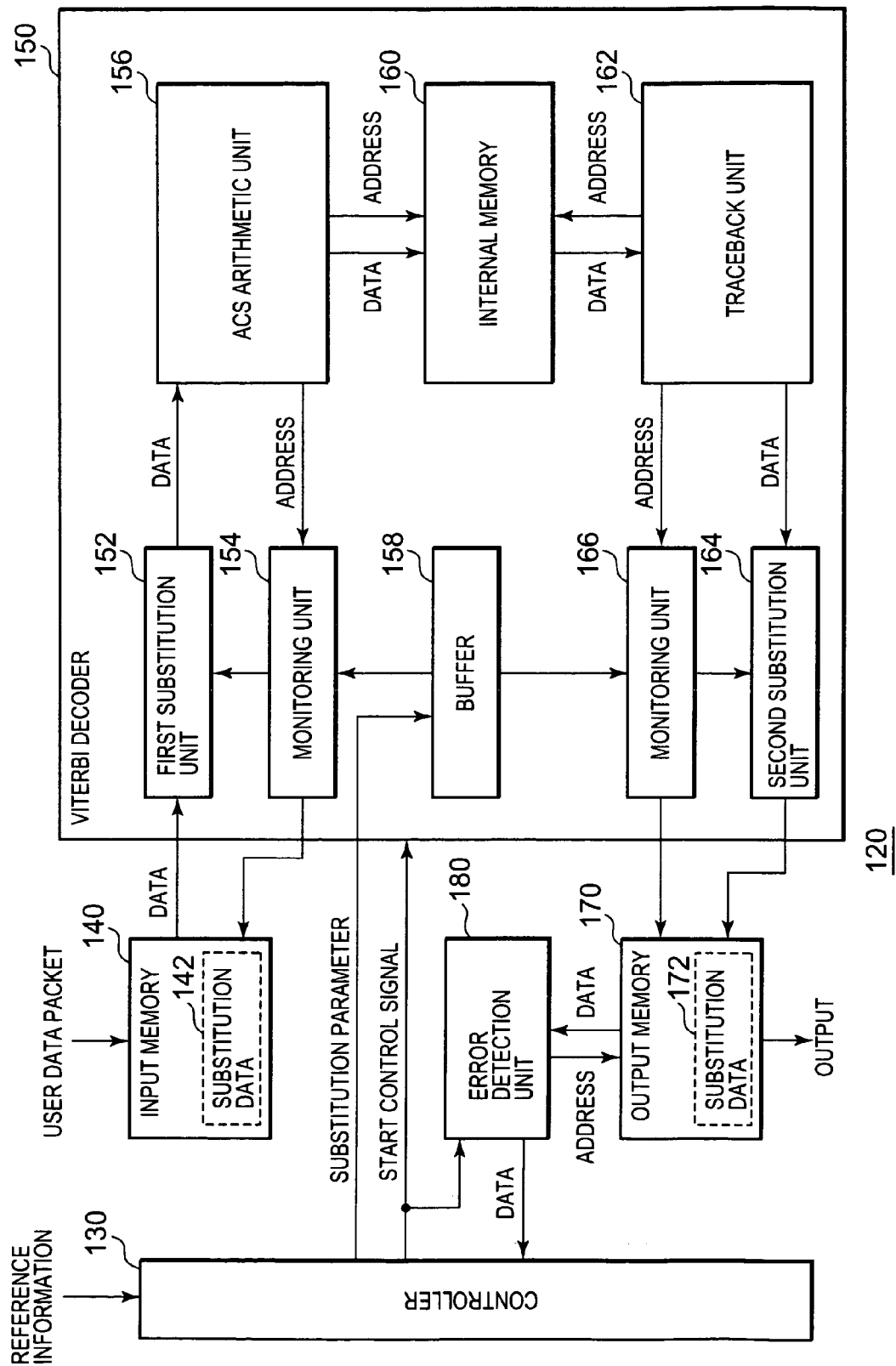
FIG. 10 is a diagram showing a user data decoder unit in the receiver set shown in FIG. 9.

Referring to FIG. 10, the user data decoder unit 120 will be described in detail.

As shown in FIG. 10, the Viterbi decoder 150 in the user data decoder unit 120 has a first substitution unit 152, a monitoring unit 154, an ACS arithmetic unit 156, a buffer 158, internal memory 160, a traceback unit 162, a second substitution unit 164, and a monitoring unit 166.

The input memory 140 stores the coded user data packet from the demodulator unit 112, and also stores substitution data 142. This substitution data 142 is a code specified by a standard that the receiver set 100 is in conformity with and that corresponds to the known data, such as the padding bit in the user data packet.

A substitution data 172 is also stored in the output memory 170. Unlike the substitution data 142 stored in the input memory 140, this substitution data 172 is absolutely the known data.

The controller 130 performs a control of starting the Viterbi decoder 150 and the error detection unit 180 by outputting a start control signal. Moreover, the controller 130 acquires substitution parameters based on the reference information from the CPU 116, and outputs them to the buffer 158 of the Viterbi decoder 150. The substitution parameters from the controller 130 are one for the first substitution unit 152 and one that the second substitution unit 164 uses.

The substitution parameters for the first substitution unit 152 are the start address and size of a portion to be replaced for the coded user data packet from the demodulator unit 112 stored in the input memory 140. The controller 130 calculates a position and the number of bits of the code corresponding to the known data based on the reference information from the CPU 116. It also acquires the start address and size of a portion that is to be replaced among codes corresponding to the known data, and outputs them to the buffer 158. That is, the controller 130 also serves as a known-code-portion detecting unit as set forth in claims. Hereafter, the portion that is to be replaced is called a substitution object.

The substitution parameters for the second substitution unit 164 are the start address and size of a portion to be replaced for the decoded data (decoded user data packet) that will be stored later in the output memory 170. Based on the reference information from the CPU 116, the controller 130 calculates the position and number of bits of the known data in the user data packet after the decoding, and outputs them to the buffer 158.

In the Viterbi decoder 150, the ACS arithmetic unit 156 repeats ACS (Add Compare Select: addition, comparison, and selection) processing, and stores a calculated result in the internal memory 160. The traceback unit 162 performs a traceback processing that is the last step of the Viterbi decoding to obtain the decoded data.

The monitoring unit 154 monitors an address when the ACS arithmetic unit 156 reads the data from the input memory 140 when the ACS operation unit 156 performs an ACS arithmetic operation, and if this address is not the address of the substitution object indicated by the substitution parameters for the first substitution unit 152, the monitoring unit 154 will read the data via the first substitution unit 152 and will provide it to the ACS operation unit 156. On the other hand, if the above-mentioned address is the address of the substitution object, the monitoring unit 154 will instruct the first substitution unit 152 to perform the substitution.

When the first substitution unit 152 is instructed to perform the substitution by the monitoring unit 154, it replaces the data at the address with the substitution data 142 stored in the input memory 140 and outputs it to the ACS arithmetic unit 156.

The monitoring unit 166 monitors an address when the traceback unit 162 writes the decoded data in the output memory 170, and if this address is not the address of the substitution object indicated by the substitution parameters for the second substitution unit 164, the monitoring unit 166 will write the decoded data outputted by the traceback unit 162 via the second substitution unit 164 in the output memory 170, as it is. On the other hand, if the address is the address of the substitution object, the monitoring unit 166 will instruct the substitution to the second substitution unit 164.

When being instructed to perform the substitution from the monitoring unit 166, the second substitution unit 164 replaces the decoded data from the traceback unit 162 with the substitution data 172 stored in the output memory 170 and outputs it to the output memory 170.

The error detection unit 180 performs the error detection on the decoded data (including the data that was replaced by the second substitution unit 164) stored in the output memory 170, and outputs a detection result to the controller 130.

The controller 130 performs error control based on the detection result from the error detection unit 180. The error control includes a processing of, when an error was detected, retransmitting the packet so as not to return ACK to the transmitting side etc.

In this way, the receiver set 100 according to this first embodiment is replacing the code corresponding to the known data with the normal data before decoding the user data packet. By doing so, even if a noise mixes into the substitution object part in the communication channel, that part will be replaced with the normal data. Moreover, since this substitution is performed prior to the decoding, an influence of the noise will not exert other data whose this portion is used at the time of the decoding. Consequently, the receiver set 100 can acquire a high error correction capability.

Furthermore, the code of other portion is used at the time of the decoding of the code corresponding to the known data. Therefore, when a noise mixes with other portions, the portion of the known data in the decoded data also has a possibility of not being the normal data. Since the receiver set 100 replaces a portion of the known data with the normal data also for the data after the decoding, it can further reduce the error in the decoded data more, and can enhance the error correction capability still more.

Moreover, since in the receiver set 100, the substitution is performed by the two substitution units with a hardware configuration installed in the Viterbi decoder 150, the receiver set 100 can attain higher speed of the processing.

<Second Exemplary Embodiment>

Figure 11:
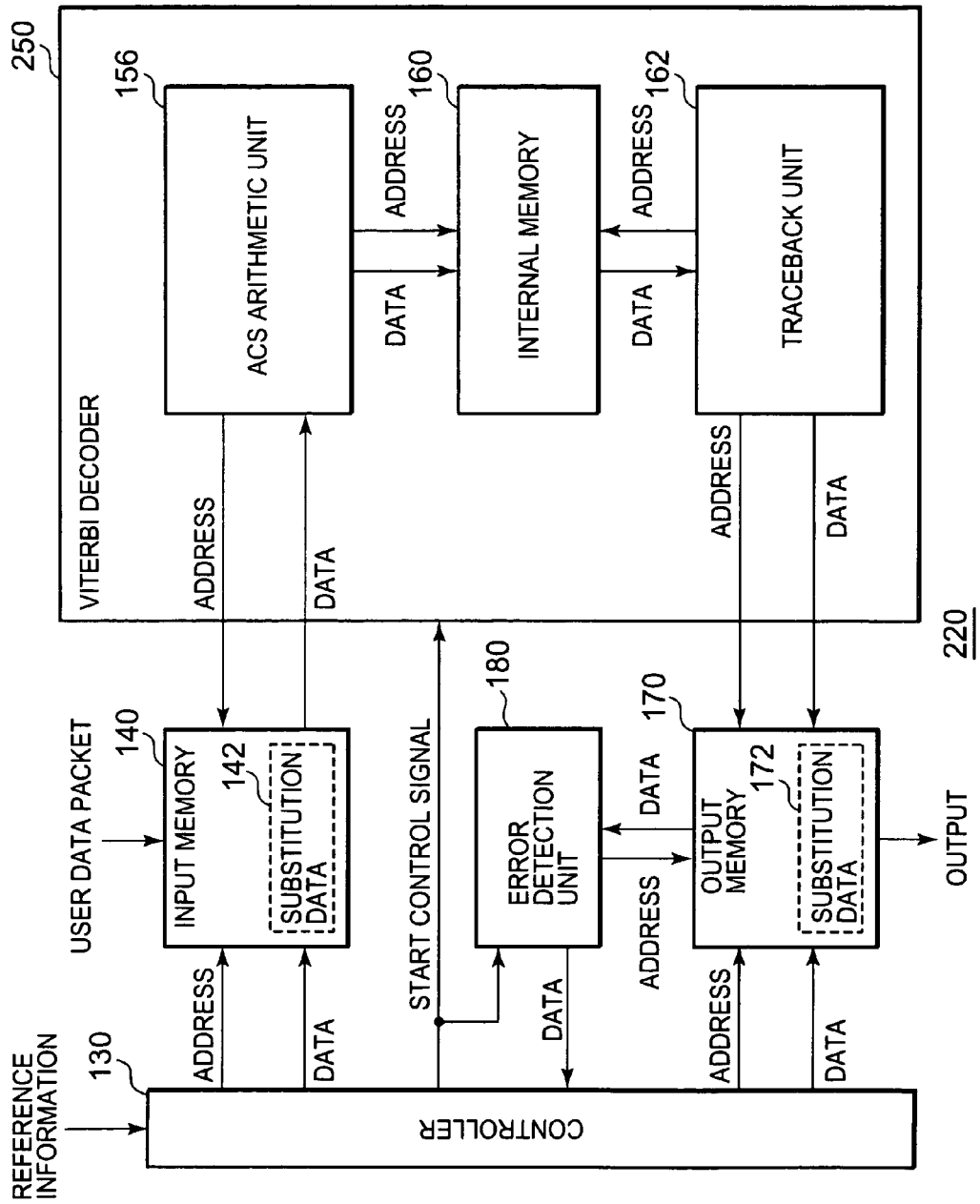
FIG. 11 is a diagram showing a user data decoder unit according to a second exemplary embodiment of the present invention.

As a second exemplary embodiment of the present invention, FIG. 11 shows a user data decoder unit 220 to which the present invention can be applied instead of the user data decoder unit 120 in the receiver set 100 shown in FIG. 1. In FIG. 11, the same components as those in the user data decoder unit 120 shown in FIG. 10 are given the same reference numerals and their explanations are omitted.

In the user data decoder unit 220 shown in FIG. 11, a controller 230 is equipped with functions of the first substitution unit 152, the monitoring unit 154, the second substitution unit 164, and the monitoring unit 166, in addition to a function of the controller 130 of the user data decoder unit 120 shown in FIG. 10. Therefore, a Viterbi decoder 250 does not have components that bear these functions, comprising the ACS arithmetic unit 156, the internal memory 160, and the traceback unit 162.

The controller 230 calculates the address and size of the substitution object part in the user data packet stored in the input memory 140 based on the reference information, and replaces that part by overwriting the portion with the substitution data 142. After the substitution, the controller 230 starts the Viterbi decoder 250 by outputting a start control signal.

Moreover, when the decoded data is written in the output memory 170 from the traceback unit 162, the controller 230 overwrites the data of the substitution object part in the decoded data with the substitution data 172. Then, after the overwriting, the controller 230 starts the error detection unit 180 by outputting the start control signal.

That is, in this exemplary embodiment, processings of the first substitution unit 152, the monitoring unit 154, the second substitution unit 164, and the monitoring unit 166 in the Viterbi decoder 150 shown in FIG. 10 are performed by a program installed in the controller 230. Because of this, the high error correction capability can be acquired similarly with the user data decoder unit 120 shown in FIG. 10, and a circuit scale can be curtailed as much as the first substitution unit 152, the monitoring unit 154, the second substitution unit 164, and the monitoring unit 166.

Further, since the data processor is configured to start the Viterbi decoder 250 after the substitution of the user data packet stored in the input memory 140 and to start the error detection unit 180 after the substitution of the decoded data stored in the output memory 170, operating times of the Viterbi decoder 250 and the error detection unit 180 can be shortened, and power consumption can be controlled.

Figure 12:
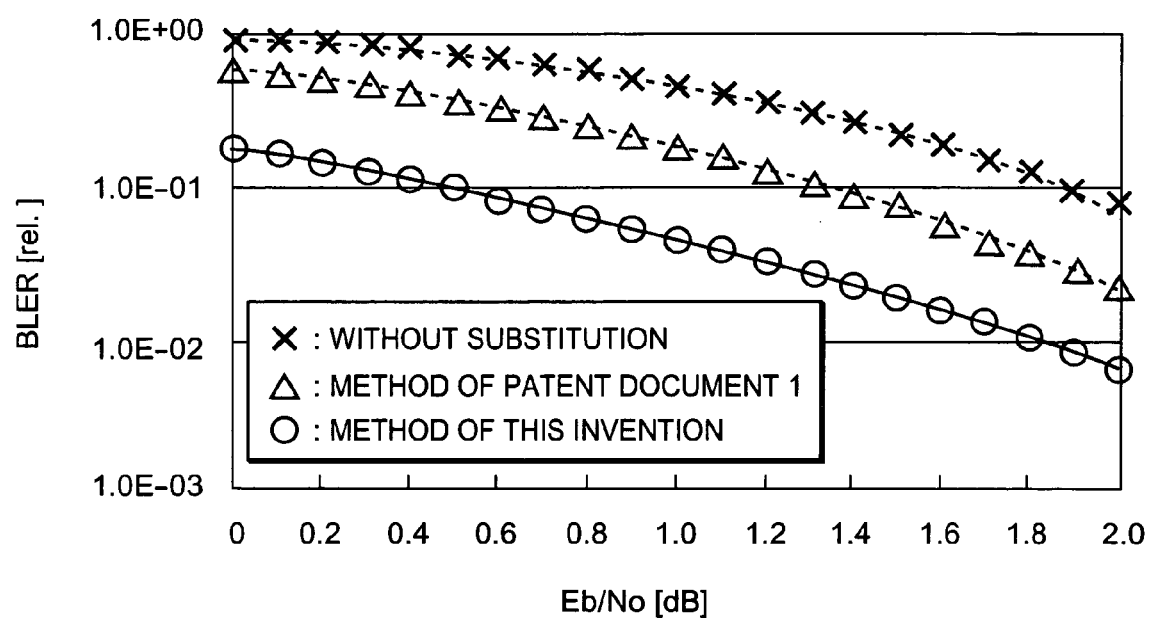
FIG. 12 is a diagram explaining an error correction capability of the user data decoder unit shown in FIG. 10 and FIG. 11.

FIG. 12 is a diagram to compare the error correction capabilities of the above-mentioned two user data decoder units to which the technology of the present invention is applied versus the error correction capability of the related technology. The horizontal axis denotes a power ratio of a signal and a noise, meaning that as the value becomes smaller, more noises exist. The vertical axis denotes a block error rate, meaning that as the value becomes smaller, fewer errors exist. Moreover, in the figure, a symbol "x" denotes a result when the substitution of the known data and a code corresponding to the known data is not performed, "Δ" denotes a result by the technique of Patent Document 1, and "o" denotes a result by the above-mentioned two user data decoder units.

For example, when Eb/No is 1.8 dB, according to the technology of the present invention, the block error rate is about 0.01; according to the technique of Patent Document, the block error rate is about 0.025; and in the case where no substitution is performed, the block error rate is about 0.1. That is, for a noise quantity of 1.8 dB equally, in the case where no substitution is performed, there is one error among 10 blocks (user data packet); according to the technique of Patent Document, there is one error among 40 blocks; and, according to the technique of the present invention, there is only one error among 100 blocks.

<Third Exemplary Embodiment>

Figure 13:
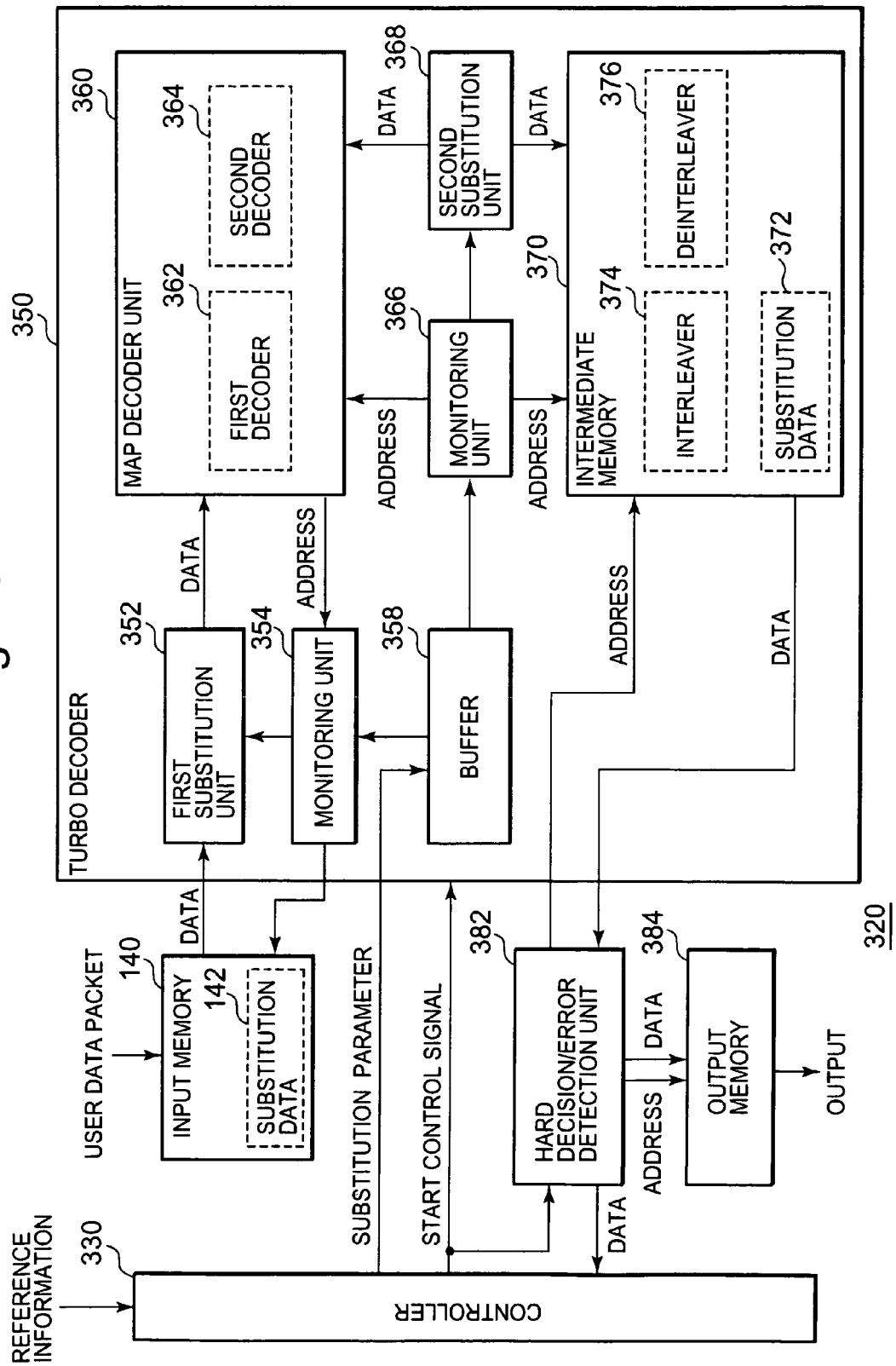
FIG. 13 is a diagram showing a user data decoder device according to a third exemplary embodiment of the present invention.

FIG. 13 shows a user data decoder device 320 according to a third exemplary embodiment of the present invention. This user data decoder device 320 is, when the receiver set 100 shown in FIG. 9 receives the turbo coded data, one to which the present invention is applied instead of the user data decoder unit 120 in the receiver set 100. In FIG. 13, components that are the same as those in the user data decoder unit 120 shown in FIG. 10 are given the same reference numerals and their explanations are omitted. In addition, as an example, modes of the coded data are three kinds, "Systematic," "First Parity," and "Second Parity" shown in FIG. 5.

The user data decoder device 320 is equipped with a controller 330, the input memory 140, a turbo decoder 350, a hard decision/error detection unit 382, and output memory 384.

The input memory 140 stores the coded user data packet, and also stores the substitution data 142. This substitution data 142 is a code specified by the standard that the user decoder device 320 is in conformity with and that corresponds to the known data, such as the filler bit in the user data packet.

The turbo decoder 350 has a first substitution unit 352, a monitoring unit 354, a buffer 358, an MAP decoder unit 360, a monitoring unit 366, a second substitution unit 368, and intermediate memory 370.

The MAP decoder unit 360 has a first decoder 362 and a second decoder 364. The intermediate memory 370 has an interleaver 374 and a deinterleaver 376, and further stores substitution data 372.

In the MAP decoder unit 360, the two decoders proceed the decoding while feeding back decoding results to each other as external information via the intermediate memory 370. This external information is intermediate data until obtaining the decoded data of the user data packet.

The first decoder 362 reads "Systematic" and "First Parity" from the input memory 140, and the external information that the second decoder 364 outputted from the deinterleaver 376, and performs the decoding of the soft output using these. Incidentally, since the external information has not been written yet in the deinterleaver 376 at the time of decoding the soft output of the first time, an intermediate value among values that the external information may take, for example zero, is used. The first decoder 362 writes the external information acquired by decoding the soft output in the interleaver 374.

Next, the second decoder 364 reads "Systematic" and "Second Parity" from the input memory 140, and the external information that the first decoder 362 outputted from the interleaver 374, and performs the decoding of the soft output using these. The second decoder 364 writes the external information acquired by the decoding of the soft output in the deinterleaver 376.

The above-mentioned processing by the first decoder 362 and the second decoder 364 is repeated for the predetermined number of times specified by the standard. In the last time, the second decoder 364 writes not the external information that the first decoder 362 uses but a logarithmic likelihood ratio of the soft output in the deinterleaver 376. Incidentally, the filler bit is excluded from the logarithmic likelihood ratio.

The hard decision/error detection unit 382 reads the logarithmic likelihood ratio from the deinterleaver 376, performs a hard decision, and outputs a result of the hard decision to the output memory 384 as the decoded data. It also detects an error based on the CRC and outputs a detection result to the controller 330.

The controller 330 performs a control of starting the turbo decoder 350 and the hard decision/error detection unit 382 by outputting a start control signal. Moreover, the controller 330 also performs an error control based on the detection result from the hard decision/error detection unit 382. The error control includes processing of, when an error was detected, retransmitting the packet so as not to return ACK to the transmitting side etc., for example.

Further, the controller 330 acquires the substitution parameters based on the reference information and outputs them to the buffer 358 of the turbo decoder 350. The substitution parameters from the controller are one for the first substitution unit 352 and one that the second substitution unit 368 uses.

The substitution parameters for the first substitution unit 352 are the start address and size of a portion that is to be replaced for the coded user data packet stored in the input memory 140. The controller 330 calculates a position of and the number of bits of a code corresponding to the known data based on the reference information, acquires the start address and size of the portion that is to be replaced, and outputs them to the buffer 358.

The substitution parameters for the second substitution unit 368 are the start address and size of the substitution object part in the external information stored in the interleaver 374 and the deinterleaver 376 of the intermediate memory 370. Based on the reference information, the controller 330 calculates the position and number of bits of the substitution object part in the external information, and outputs them to the buffer 358.

The intermediate memory 370 stores the substitution data 372. Unlike from the substitution data 142 stored in the input memory 140, this substitution data 372 is the normal data of the substitution object part in the external information.

The monitoring unit 354 monitors an address when the MAP decoder unit 360 reads data from the input memory 140, and if this address is not the address of the substitution object indicated by the substitution parameter for the first substitution unit 352, then the monitoring unit 354 will read the data via the first substitution unit 352 and will provide it to the MAP decoder unit 360. On the other hand, if the above-mentioned address is the address of the substitution object, the monitoring unit 354 will instruct the first substitution unit 352 to perform the substitution.

If the substitution is instructed by the monitoring unit 354, then the first substitution unit 352 will replace the data of the address with the substitution data 142 stored in the input memory 140, and will output it to the MAP decoder unit 360.

The monitoring unit 366 monitors an address when the MAP decoder unit 360 writes the external information in the intermediate memory 370, and if this address is not the address of the substitution object indicated by the substitution parameter for the second substitution unit 368, the monitoring unit 366 will output the external information to the intermediate memory 370 via the second substitution unit 368. On the other hand, if the above-mentioned address is the address of the substitution object, then the monitoring unit 366 will instruct the second substitution unit 368 to perform the substitution.

When the substitution is instructed by the monitoring unit 366, the second substitution unit 368 will replace the external information from the MAP decoder unit 360 with the substitution data 372, and will write it in the intermediate memory 370.

The monitoring unit 366 and the second substitution unit 368 perform the same processing also when the MAP decoder unit 360 reads the external information from the intermediate memory 370, they replace the portion of the substitution object in the external information with the substitution data 372, and provide it to the MAP decoder unit 360.

In this way, the user data decoder device 320 according to this third embodiment is replacing the code corresponding to the known data with the normal data, prior to the decoding of the user data packet that was turbo coded. By doing this, even if a noise mixes into the substitution object part in the communication channel, it will be replaced with the normal data. Moreover, since this substitution is performed prior to the decoding, an influence of the noise will not exert other data whose this portion is used at the time of the decoding.

Further, since the user data decoder device 320 is replacing a portion corresponding to the known data with the normal data also for the data under the decoding (external information), it can reduce an error further and can enhance the error correction capability more.

Moreover, with the user data decoder device 320, the substitution is performed by two substitution units with a hardware configuration installed in the turbo decoder 350, higher speed of the processing can be attained.

<Fourth Exemplary Embodiment>

Figure 14:
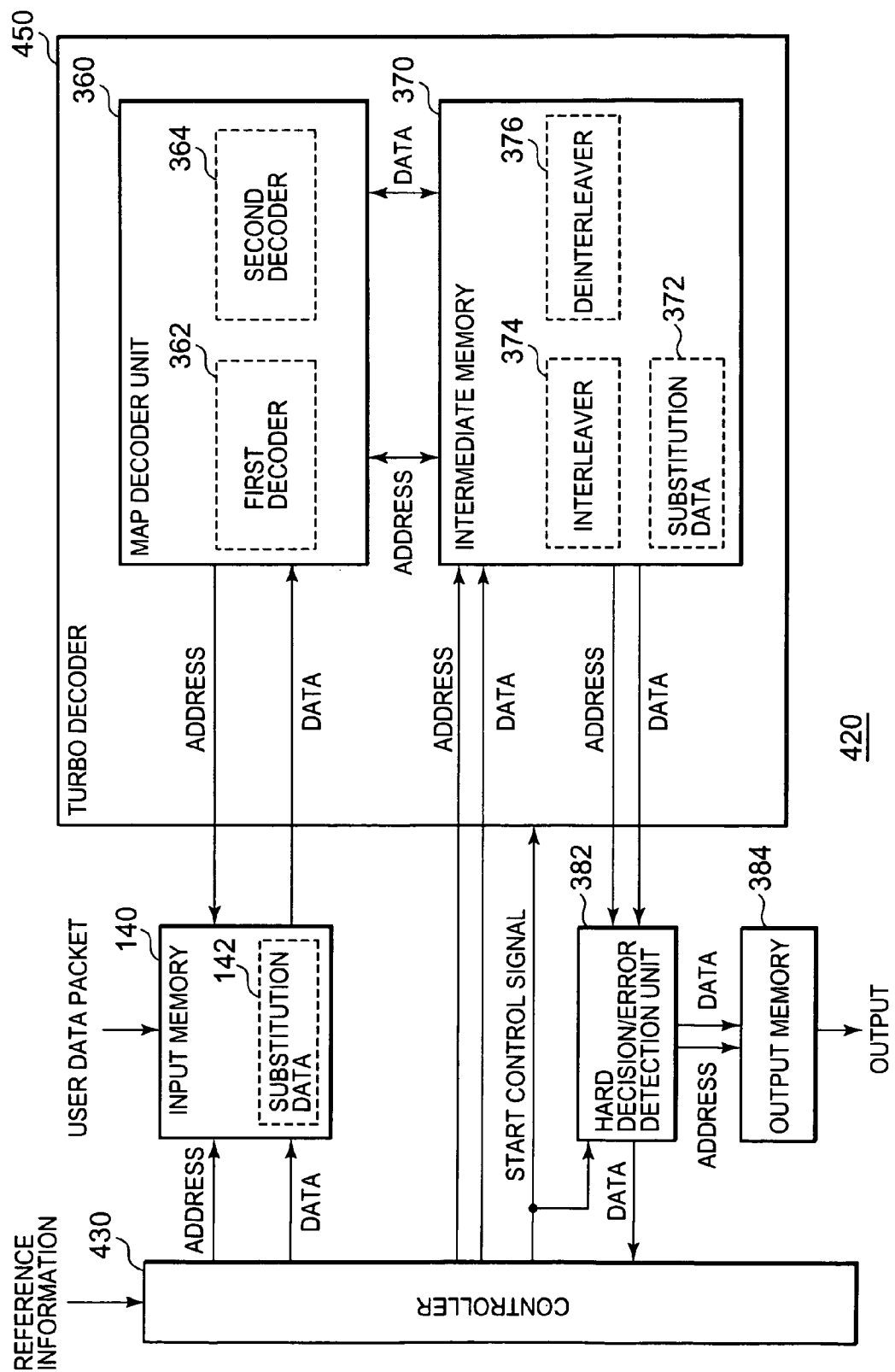
FIG. 14 is a diagram showing a user data decoder device according to a fourth exemplary embodiment of the present invention.

FIG. 14 shows a user data decoder device 420 according to a fourth exemplary embodiment of the present invention. In FIG. 14, the same components as those of the user data decoder device 320 shown in FIG. 13 are given the same reference numerals and their explanations are omitted.

In the user data decoder device 420 shown in FIG. 14, a controller 430 is equipped with functions of the first substitution unit 352, the monitoring unit 354, the monitoring unit 366, and the second substitution unit 368, in addition to the function of the controller 330 of the user data decoder device 320 shown in FIG. 13. Therefore, there is no component that bears these functions in a turbo decoder 450, which includes the MAP decoder unit 360 and the intermediate memory 370.

Based on the reference information, the controller 430 calculates the address and size of the substitution object part in the user data packet stored in the input memory 140, and replaces that part by overwriting the part with the substitution data 142. After the substitution, the controller 430 starts the turbo decoder 450 by outputting a start control signal.

Moreover, when the external information is written in the intermediate memory 370 by the MAP decoder unit 360, the controller 430 overwrites the substitution object part in the external information with the substitution data 372. Then, after the overwriting, the controller 430 starts the hard decision/error detection unit 382 by outputting the start control signal.

That is, in this exemplary embodiment, processings of the first substitution unit 352, the monitoring unit 354, the second substitution unit 368, and the monitoring unit 366 in the turbo decoder 350 shown in FIG. 13 are performed by software installed in the controller 430. Because of this, the high error correction capability can be acquired similarly with the user data decoder device 320 shown in FIG. 13. It can also curtail (minimize) a circuit scale as much as circuits of the first substitution unit 352, the monitoring unit 354, the second substitution unit 368, and the monitoring unit 366.

Furthermore, since the data processor is configured to start the turbo decoder 450 after the substitution of the user data packet stored in the input memory 140 and to start the hard decision/error detection unit 382 after the substitution of the external information stored in the intermediate memory 370, operating times of the turbo decoder 450 and the hard decision/error detection unit 382 can be shortened, and power consumption can be controlled.

Figure 15:
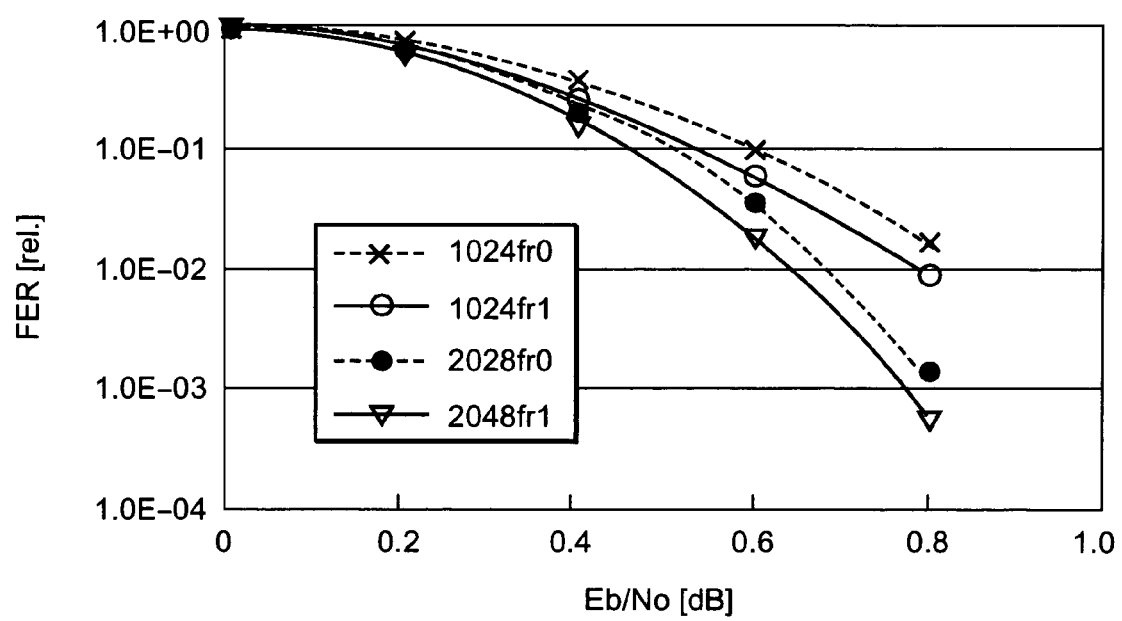
FIG. 15 is a diagram explaining an error correction capability of the user data decoder device shown in FIG. 13 and FIG. 15.
Figure 16:
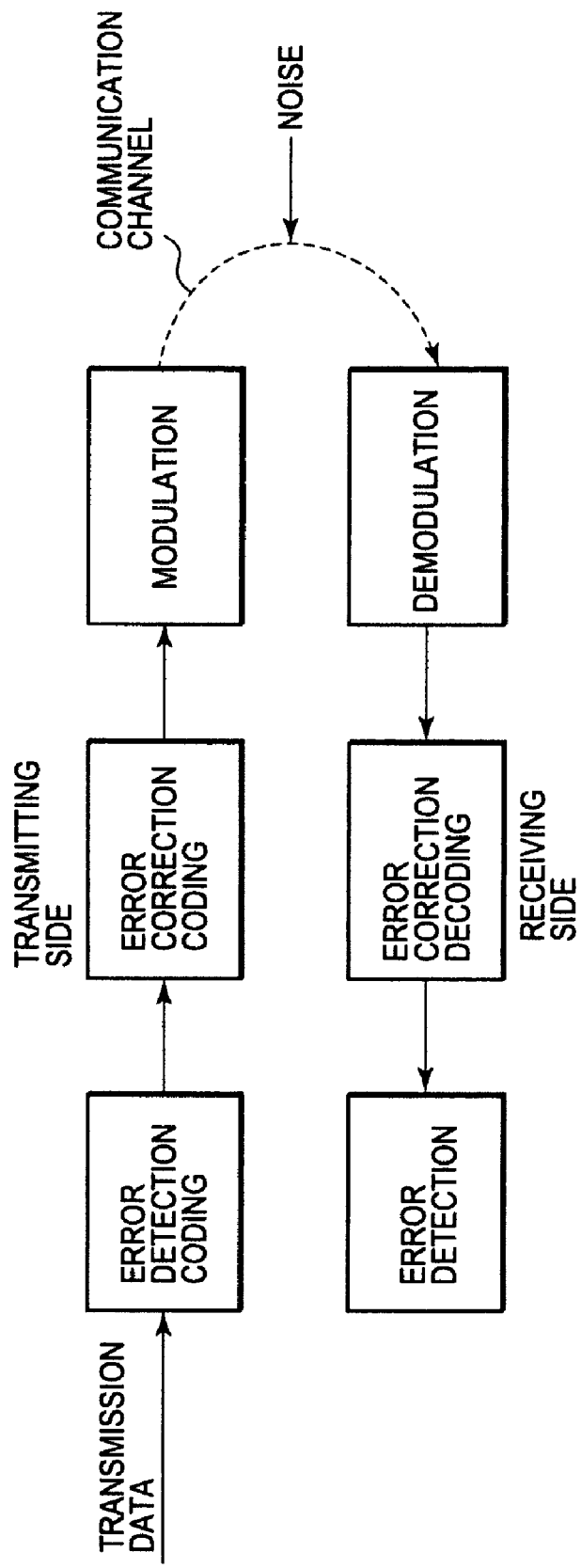
FIG. 16 is a diagram showing a schematic that outlines a digital communication system.
Figure 17:
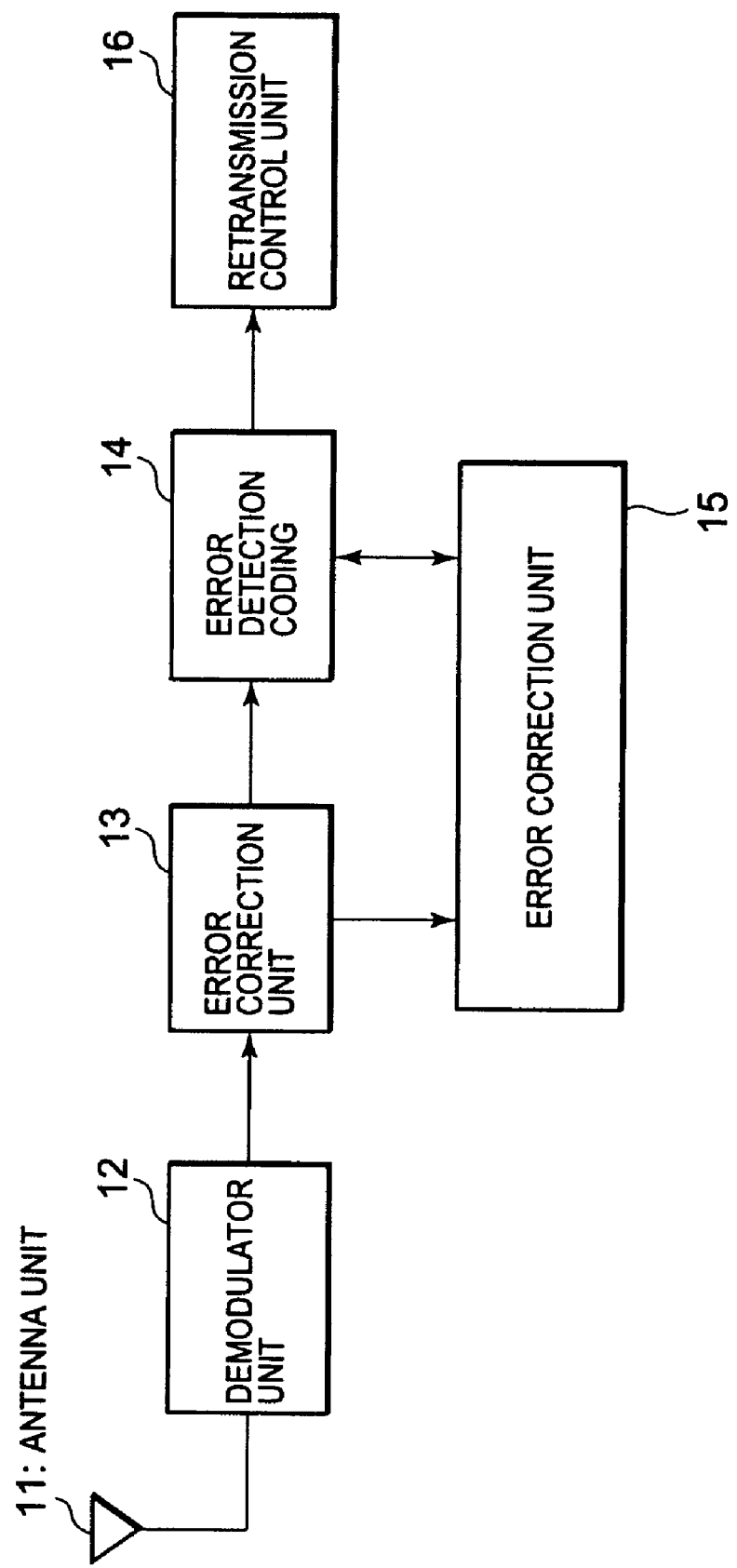
FIG. 17 is a diagram showing a receiver set according to a technology of the related art.
Figure 18:
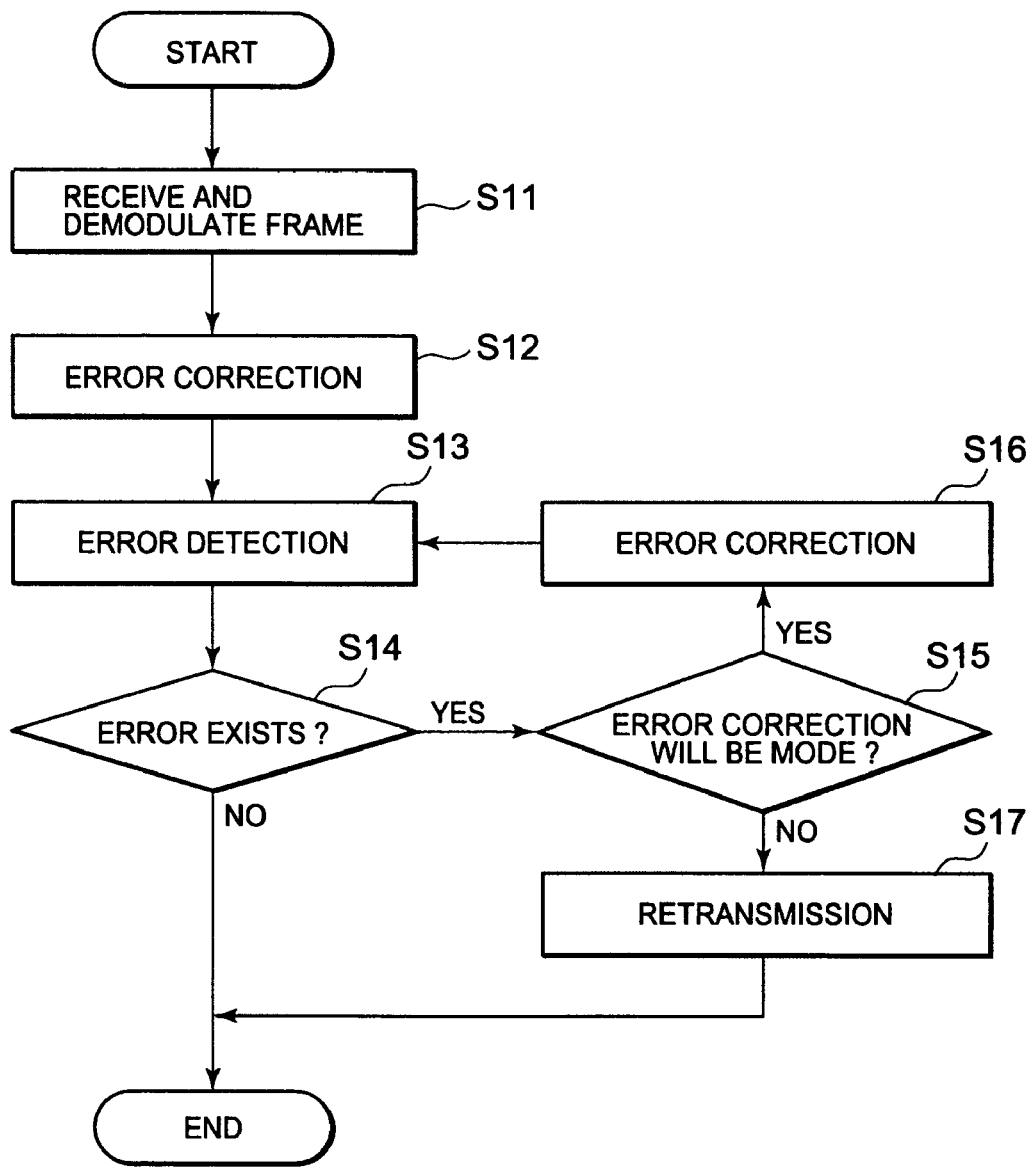
FIG. 18 is a flowchart showing a flow of processing in the receiver set shown in FIG. 17.

FIG. 15 is a diagram to compare the error correction capabilities of the user data decoder device 320 shown in FIG. 13 and of the user data decoder device 420 shown in FIG. 14 versus the error correction capability of the conventional technology where the substitution is not performed for the known data. The horizontal axis denotes a power ratio of a signal and a noise, and the vertical axis denotes a frame error rate having the same meaning as the block error of FIG. 12. A solid line shows the result of applying the technology of the present invention, and a dotted line shows the result of conventional technology, respectively. In notations of "1024fr0" and "1024fr1" in the figure, a numerical value in front of "fr" indicates the size of a frame (user data packet), a numerical value "0" after "fr" indicates the case of the conventional technology, and a numerical value "1" after "fr" indicates the case of the technology of the present invention. Incidentally, the size of the filler bits is also different with the size of the frame. For example, there are the filler bits of 31 bits in the 1024-bit frame, and there are the filler bits of 63 bits in the 2048-bit frame.

FIG. 15 shows, in any frame size, according to the technology of the present invention, it is found that the frame error rate is lower than that of the conventional technology for the same noise volume.

Further, coding gains to obtain the same frame error will be compared. For example, when the frame error rate is 0.1 (one frame is erred for ten frames), in either frame size of 1024 bits or 2048 bits, the technology of the present invention has realized improvement in coding gain by about 0.06 dB or so from the related technology. This means that power necessary to transmit the same volume of data can be reduced.

In the foregoing, the present invention was explained based on its exemplary embodiments. The exemplary embodiments are illustrative ones, and unless it deviates from the purport of the present invention, it may be added with various alterations and increases/decreases. A person skilled in the art can understand that variants of the exemplary embodiments added with these alterations and increases/decreases are also in the range of the present invention.

For example, in each exemplary embodiment described above, since all the pieces of the known data are "0s," the substitution data prior to the decoding is one kind of the code corresponding to such known data, and the substitution data after the decoding is the same "0" as the known data. In the case where there is also a possibility that the known data that the transmitting side uses is any one of the followings: "0" for all the data, "1" for all the data, and "0" and "1" interwoven with one another, it may be adopted to prepare two or more kinds of substitution data prior to/after the decoding that correspond to respective cases and to use selectively the two or more kinds of substitution data according to the kind of the known data notified by the control data.

Moreover, in the case where the arrangement pattern of the known data is complicated, it may be adopted to provide the same encoder on the receiving side as the encoder on the transmitting side and to create the substitution data prior to the decoding by inputting the known data of the arrangement pattern notified by the control data into this encoder to encode it.

Further, it is noted that Applicant's intent is to encompass equivalents of all claim elements, even if amended later during prosecution.

What is claimed is:

1. A data processor, comprising:
a storage unit which stores a normal data of a known code portion, the known code portion corresponding to a known data and being included in a coded data;
a receive unit which receives the coded data;
a known-code-portion detecting unit which detects the known code portion of the coded data received by the receive unit;
a substitution unit which replaces at least a part of the known code portion detected by the known-code-portion detecting unit, with the normal data stored in the storage unit; and
a decoder unit that, when there is none of the known code portion as a result of detection by the known-code-portion detecting unit, decodes the coded data received by the receive unit, and, when there is the known code portion detected by the known-code-portion detecting unit, decodes the coded data replaced by the substitution unit,
wherein the coded data comprises data that is convolutionally coded, the data processor further comprising:
a second storage unit which stores the known data; and
a second substitution unit that, when the known code portion was detected by the known-code-portion detecting unit, replaces a portion corresponding to the known data in decoded data of the coded data obtained by the decoder unit, with the known data stored in the second storage unit.

2. The data processor as claimed in claim 1, wherein the known data comprises a code specified by a standard with which the receive unit is in conformity.

3. The data processor as claimed in claim 2, wherein the known data comprises the code corresponding to a padding bit.

4. The data processor as claimed in claim 3, wherein the known data comprises the code corresponding to a filler bit.

5. A data processor, comprising:
a storage unit which stores a normal data of a known code portion, the known code portion corresponding to a known data and being included in a coded data;
a receive unit which receives the coded data;
a known-code-portion detecting unit which detects the known code portion of the coded data received by the receive unit;
a substitution unit which replaces at least a part of the known code portion detected by the known-code-portion detecting unit, with the normal data stored in the storage unit; and
a decoder unit that, when there is none of the known code portion as a result of detection by the known-code-portion detecting unit, decodes the coded data received by the receive unit, and, when there is the known code portion detected by the known-code-portion detecting unit, decodes the coded data replaced by the substitution unit, wherein the coded data comprises data that is turbo coded,
wherein the decoder unit includes two decoders and an intermediate memory and repeats an operation of making the two decoders execute respectively at earlier and later times,
wherein the intermediate memory stores an intermediate data that includes respective execution results of the two decoders, and
wherein each of the two decoders, at a time of execution by one of the two decodes, reads the intermediate data that was obtained by the other of the two decoders just before the execution by the one from the intermediate memory, and
wherein the data processor further comprises:
   a second storage unit which stores the normal data of a portion corresponding to the known data that may be included in the intermediate data; and
   a second substitution unit that, when the known code portion was detected by the known-code-portion detecting unit, replaces at least a part of the intermediate data corresponding to the known data, with the normal data stored in the second storage unit.

6. The data processor as claimed in claim 5, wherein the known data comprises a code specified by a standard with which the receive unit is in conformity.

7. The data processor as claimed in claim 6, wherein the known data comprises the code corresponding to a padding bit.

8. The data processor as claimed in claim 7, wherein the known data comprises the code corresponding to a filler bit.

9. A data processor, comprising:
   a storage unit which stores a normal data of a known code portion, the known code portion corresponding to a known data and being included in a coded data;
   a receive unit which receives the coded data;
   a known-code-portion detecting unit which detects the known code portion of the coded data received by the receive unit;
   a substitution unit which replaces at least a part of the known code portion detected by the known-code-portion detecting unit, with the normal data stored in the storage unit;
   a decoder unit that, when there is none of the known code portion as a result of detection by the known-code-portion detecting unit, decodes the coded data received by the receive unit, and, when there is the known code portion detected by the known-code-portion detecting unit, decodes the coded data replaced by the substitution unit;
   a demodulator which is responsive to the coded data to produce a control data packet and a user data packet;
   an input memory which receives the user data packet and includes the storage unit; and
   a controller which receives an information relating to the control data packet, and produces a substitution parameter to identify the known data.

10. The data processor as claimed in claim 9, wherein the known data comprises a code specified by a standard with which the receive unit is in conformity.

11. The data processor as claimed in claim 10, wherein the known data comprises the code corresponding to a padding bit.

12. The data processor as claimed in claim 11, wherein the known data comprises the code corresponding to a filler bit.

* * * * *